United States Patent

Kobayashi

[15] 3,651,385

[45] Mar. 21, 1972

[54] SEMICONDUCTOR DEVICE INCLUDING A POLYCRYSTALLINE DIODE

[72] Inventor: Isamu Kobayashi, Yokohama-shi, Japan

[73] Assignee: Sony Corporation, Tokyo, Japan

[22] Filed: Sept. 16, 1969

[21] Appl. No.: 858,287

[30] Foreign Application Priority Data

Sept. 18, 1968 Japan....................................43/67380
Sept. 18, 1968 Japan....................................43/67382

[52] U.S. Cl...............................................317/234, 317/235
[51] Int. Cl...............................................H01l 3/00
[58] Field of Search..........................................317/234, 235

[56] References Cited

UNITED STATES PATENTS

| | | | |
|---|---|---|---|
| 3,080,441 | 3/1963 | Willardson et al. | 136/5 |
| 3,290,567 | 12/1966 | Gowen | 317/234 |
| 3,332,810 | 7/1967 | Kimura | 148/33.2 |
| 3,335,038 | 8/1967 | Doo | 148/175 |
| 3,442,823 | 5/1969 | Muller | 252/518 |
| 3,475,661 | 10/1969 | Iwata | 317/234 |
| 3,486,087 | 12/1969 | Legat | 317/235 |

*Primary Examiner*—James D. Kallam
*Attorney*—Hill, Sherman, Meroni, Gross & Simpson

[57] ABSTRACT

A semiconductor device consisting of a single crystal region, a polycrystalline region integrally formed on the single crystal region and a PN junction formed in the polycrystalline region.

6 Claims, 28 Drawing Figures

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

INVENTOR.
ISAMU KOBAYASHI

BY Hill, Sherman, Meroni, Gross & Simpson ATTORNEYS

SEMICONDUCTOR DEVICE INCLUDING A POLYCRYSTALLINE DIODE

BACKGROUND OF THE INVENTION

1. Field of the Invention

This invention relates to a novel semiconductor device, and more particularly to a semiconductor device which utilizes a polycrystalline layer composed of an aggregate of fine vapor growth crystals.

2. Description of the Prior Art

The present conventional semiconductor techniques are entirely based on a single crystal semiconductor from a point-contact transistor to an integrated circuit. Namely, a single crystal semiconductor is produced, for example, by the pull method and is then divided into individual single crystal semiconductor wafers and the resulting wafers are subjected to vapor deposition, diffusion, vapor growth and like processes to provide desired semiconductor devices. On the assumption that the semiconductor wafers are of complete, uniform and defect-free single crystals, no attention has been paid to the utilization of polycrystal semiconductors.

A major cause for the nonuse of the polycrystalline semiconductors is a difficulty in the making of controlled, uniform and desired polycrystalline semiconductors. Further, it appears that the polycrystalline semiconductors could not have been used in elements having PN junctions such, for example, as diodes, transistors and so on because the diffusion velocity of an impurity through grain boundaries in the polycrystalline region is far higher than in the other regions so that the impurity concentration is not uniform throughout the diffused layer.

The vapor growth method has long been used in the art. This method is to decompose a silicon halide under high temperature conditions and deposit silicon on a crystalline or noncrystalline substrate in the presence of, for example, a halogenated gas so as to provide a crystalline layer of a property similar to or identical with that of the substrate. At present, the vapor growth method is employed solely for the making of a single crystal layer.

SUMMARY OF THE INVENTION

This invention is directed to the provision of a novel semiconductor device which is formed of a polycrystalline semiconductor composed of an aggregate of fine vapor growth crystals but exhibits performance and characteristics equal to or more excellent than those of a prior art semiconductor device formed of a single crystal semiconductor.

A polycrystalline layer used in the present invention is an aggregate of fine vapor growth crystals formed substantially straight in one direction and the crystals are arranged close to one another, so that an impurity diffusion into the polycrystalline layer leads to the formation of a diffused region of a shape similar to that of a region obtainable in a usual single crystal layer. Further, the time required for the formation of, for example, a PN junction is very short, as compared with that in the case of the single crystal semiconductor.

Generally, innumerable dislocations and lattice defects are present in the polycrystalline region and act as traps, which results in the shortening of the life time of carriers in the region. Consequently, a diode of this invention has an extremely short recovery time and an appreciably reduced junction capacitance, and hence is most suited as a high-speed diode.

The present invention enables the simultaneous formation of a polycrystalline region and a single crystal region, and hence allows ease in the fabrication of a semiconductor device and, in addition, the invention enables the formation of a quick-response element and a usual element on the same substrate.

Accordingly, one object of this invention is to provide a semiconductor device in which a junction is formed in a polycrystalline region composed of an aggregate of fine crystals.

Another object of this invention is to provide a semiconductor device in which the life time of carriers is short.

Still another object of this invention is to provide a semiconductor device which consists of circuit elements of different carrier life times.

Other objects, features and advantages of this invention will become apparent from the following description taken in conjunction with the accompanying drawings.

DESCRIPTION OF THE PREFERRED EMBODIMENTS

In FIG. 1 there is illustrated one example of this invention as applied to the manufacture of a diode. The manufacture begins with the preparation of a substrate 101 formed of, for example, an N-type silicon single crystal wafer of high impurity concentration such as depicted in FIG. 1A. As will be described later, the substrate 101 need not always be of a complete single crystal wafer but may be of an incomplete or defective or, in some cases, polycrystalline wafer. It is also possible to use a substrate as of mica, ceramic or the like.

Figure 1A:
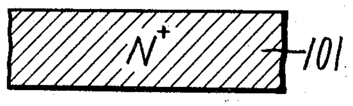
FIG. 1 is a series of sketches showing in cross section on a greatly enlarged scale a semiconductor device according to this invention as it appears in various stages of manufacture.
Figure 1B:
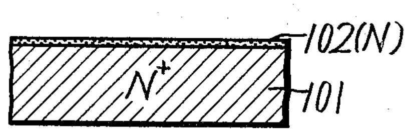

Then, the substrate 101 is coated over its entire surface with a layer 102, as depicted in FIG. 1B, which will serve as a nucleus or seeding site for the subsequent formation of a polycrystalline vapor growth layer. The formation of the layer 102 may take place by the vapor deposition or vapor growth of silicon at a low temperature. In a typical low-temperature vapor growth method, the substrate 101 is heated at a temperature of 500° to 550° C. in a reaction chamber and a hydrogen or other inert gas stream containing monosilane $SiH_4$ is passed over the heated substrate 101 at the rate of 2 to 3 liters per minute, thereby forming the layer 102 having a thickness of about 0.5 to 3 microns. The temperature condition is important: a temperature of less than about 500° C. does not cause the deposition of the silicon layer and too high a temperature (700° to 800° C.) results in the formation of a monocrystalline layer having many dislocations, which cannot be used in this invention. It will be readily understood that the nucleus layer 102 may be formed by means of a sand-blast, scratching, sputtering or like method under suitable conditions. In short, the layer 102 is not limited to a specific one so long as it is formed of a material which is fine, has no particular crystallographic axis and is capable of serving as a nucleus for subsequent vapor growth. Further, it is also possible to form a noncrystalline layer as of silicon dioxide by means of thermal oxidation or thermal decomposition in place of the nucleus layer 102.

Figure 1C:
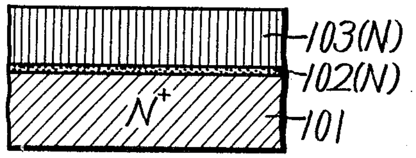

The next step consists in the formation of a polycrystalline layer 103 on the nucleus or seeding site layer 102 by the vapor growth techniques as shown in FIG. 1C. In my experiment a gas stream of silicon tetrachloride $SiCl_4$ and arsenic tetrachloride $AsCl_4$ was passed over the substrate 101 with the layer 102 thereon at a temperature of approximately 1,100° to 1,200° C. in the presence of hydrogen gas supplied at the rate of about 8 liters per minute, by which an N-type polycrystalline vapor growth layer was formed about 10 microns thick in about 10 minutes. It was ascertained by an electron microscope that the resulting polycrystalline vapor growth layer was an aggregate of fine vapor growth crystals extending up substantially straight from the nucleus layer or the noncrystalline layer substantially in one direction. The fine crystals are closely arranged and the space between adjacent crystals is so narrow as not to be optically detectable. In the drawings the polycrystalline vapor growth layer 103 is vertically hatched for convenience of illustration.

Figure 1D:
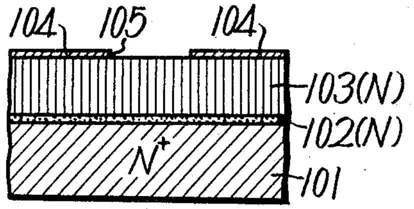
Figure 1E:
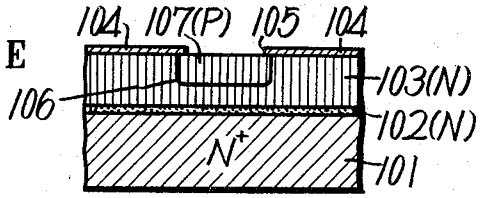

Subsequent to the formation of the polycrystalline vapor growth layer 103, the layer 103 is coated over its entire surface with a silicon dioxide or silicon nitride layer 104 by means of thermal oxidation, vapor growth, vapor deposition or the like and the layer 104 is removed, for example, by photoresist techniques selectively at a predetermined area to provide a window 105, as depicted in FIG. 1D, through which a P-type impurity is diffused into the polycrystalline vapor growth layer 103, as shown in FIG. 1E. One method of this impurity diffusion is to deposit boron at least on the area of the layer 103 exposed through the window 105 by thermal decomposition of boron oxide and heat the wafer at a temperature of approximately 1,200° C. for 30 minutes. The diffusion velocity in the polycrystalline layer is higher than that in the single crystal semiconductor and in the above process the impurity diffuses to a depth of about 6 microns to provide a diffused region 107 and a PN junction 106 in the polycrystalline vapor growth layer 103. In usual polycrystalline semiconductors produced by the prior art the crystals are not uniform in grain size and an impurity diffuses along the grain boundaries, so that the diffused plane is appreciably uneven and the diffused junction is adversely affected by the dislocations. With the present invention, however, the grain size of the crystals is smaller than that of the crystals obtainable with the prior art and the diffused plane is not uneven, which leads to the formation of a PN junction similar to that obtainable with the impurity diffusion into the single crystal semiconductor. Further, in the present invention the surface of the polycrystalline layer is not only different from that of the usual single crystal layer but also a little depressed from the surface of the single crystal vapor growth layer, so that no special lapping or etching is required for mounting of an optical mask for forming the window and the mask can be closely mounted.

Figure 1F:
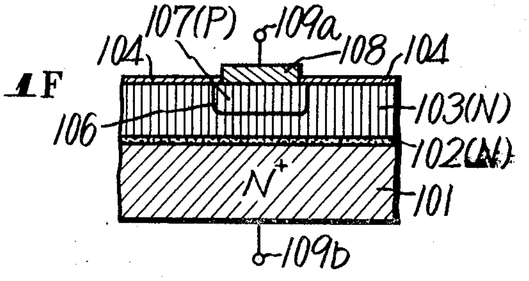

Then, an electrode 108 as of aluminum is formed on the P-type region 107 and leads **109*a* and 109*b* are respectively connected to the electrode 108 and the substrate 101, thus providing a diode such as depicted in FIG. 1F. In this case it is possible to etch away one portion of the silicon dioxide layer 104 overlying the N-type polycrystalline vapor growth layer 103, form an electrode of aluminum or the like and connect the lead 109*a*** to the electrode.

Figure 2A:
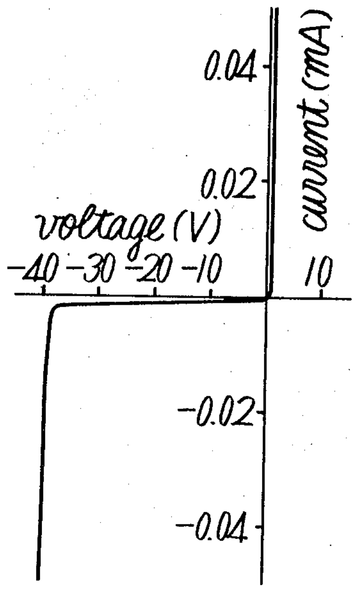
FIGS. 2 and 3 are graphs showing characteristics of a diode of this invention and a prior art diode.
Figure 2B:
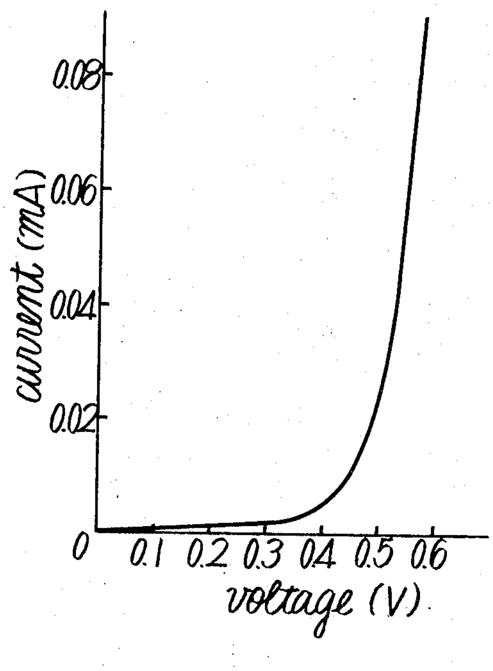
Figure 3A:
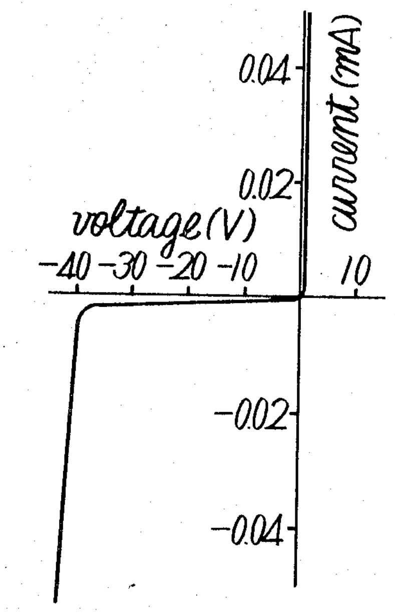
Figure 3B:
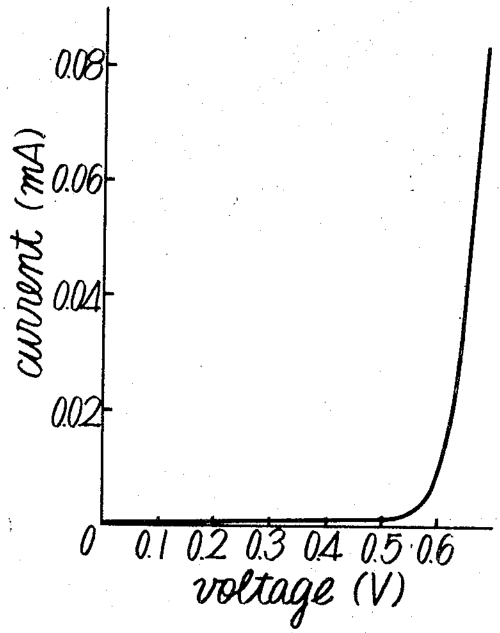

The junction capacitance Cj of the diode thus produced was approximately 2 × 2×10$^{4PF}$/cm.$^2$, which was approximately from one-fourth to one-tenth of that of a conventional diode formed of a single crystal semiconductor. FIGS. 2A and 2B respectively show the backward and forward characteristics of the diode produced according to this invention, while FIGS. 3A and 3B illustrate the characteristics of a prior art diode made of a single crystal semiconductor. It appears from the figures that the rise-up characteristic of the diode of this invention is highly excellent (for example, less than 0.5 V.) and that its backward characteristic is similar to that of the conventional diode. In the measurements the diode of this invention produced a current of less than −0.1$\mu$A and a resistance as high as 10 to 100 MΩ when exposed to a bias of −1V. Further, the voltage independency of the junction capacitance Cj is very low and the backward recovery time is very short. Namely, the diode of this invention exhibited characteristics which could not have been obtained with the conventional diode. This is considered to be caused by the presence of numerous dislocations in the polycrystalline region which act as traps to shorten the life of the carriers. Accordingly, the diode produced according to this invention is suitable for use as a high-speed diode.

While, a detailed examination of the aforementioned vapor growth polycrystalline layer 103 showed that the shapes of the polycrystals were different under the influence of the shape and property of the nucleus or non-crystalline layer. Namely, in the event that the vapor growth polycrystalline layer was formed on a nucleus layer formed by the low-temperature vapor growth or vapor deposition of silicon, the polycrystals were fine acicular ones of a size from about 0.6 to 5$\mu$. Where the polycrystalline vapor growth layer was formed on a glassy, non-crystalline silicon dioxide layer deposited on a slice, the resulting crystals were a little larger than those on the aforementioned nucleus layer and the range of their grain sizes was as wide as about 0.8 to 30$\mu$. However, it should be noted that the grain size of the polycrystals is as small as about 30$\mu$ at a maximum and that this size is far smaller than that (greater than 100 $\mu$ on the average) of usual polycrystals obtainable with the prior art method.

There is substantially no difference in the junction capacitance Cj(2 − 3 × 10$^{4PF}$/cm.$^2$) between the diodes using the nucleus layer and the non-crystalline layer. The reverse current is less than 10$^{-2}\mu$A in the former and less than 10$^{116}$ $^1\mu$A in the latter and thus there is a difference on the order of about one unit. However, the reverse current of 10$^1\mu$A is extremely lower than that of the conventional diode to provide for enhanced characteristics.

Figure 4:
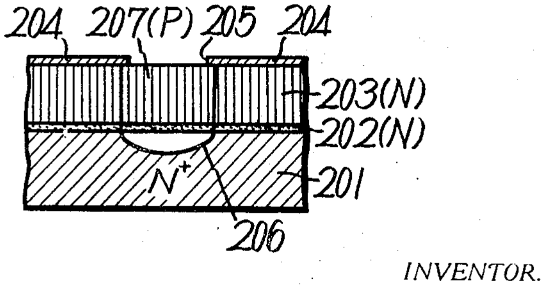
FIG. 4 is a cross-sectional view schematically illustrating a modified form of this invention.

Although the PN junction 106 is formed in the polycrystalline vapor growth layer 103 in the foregoing example, it is also possible to form a PN junction 206 such as shown in FIG. 4 which extends from a polycrystalline vapor growth layer 203 down past a nucleus layer 202 and into a substrate 201.

Figure 5:
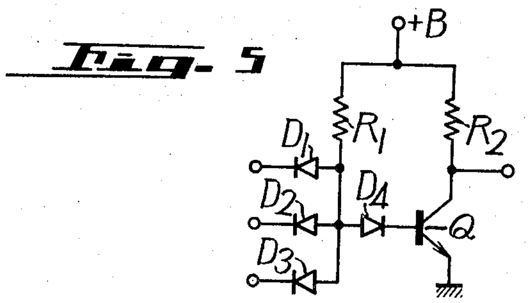
FIG. 5 is a circuit connection diagram showing one example of a logic circuit produced according to this invention.

FIG. 5 schematically shows one portion of an NAND circuit used in computers, in which reference characters $D_1$ to $D_3$ designate input diodes, $D_4$ a level-shift diode, Q a transistor and $R_1$ and $R_2$ bias resistors.

FIG. 6 illustrates another example of this invention as applied to the manufacture of an integrated circuit, for example, the NAND circuit depicted in FIG. 5. The manufacture begins with the preparation of a silicon single crystal semiconductor substrate 301 such as shown in FIG. 6A, which is a silicon slice containing gallium as an impurity and having a resistivity of 4 to 6 ohms, a thickness of about 200 microns and a diameter of 50 mm. One surface **301*a*** of the slice is treated to be mirror-like.

Figure 6A:
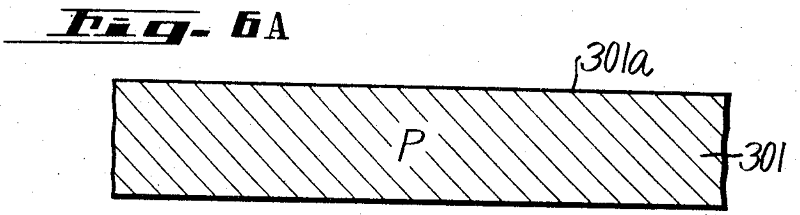
FIG. 6 is a series of greatly enlarged cross-sectional views similar to those of FIG. 1 and illustrating the successive steps involved in the manufacture of the logic circuit shown in FIG. 5.
Figure 6B:
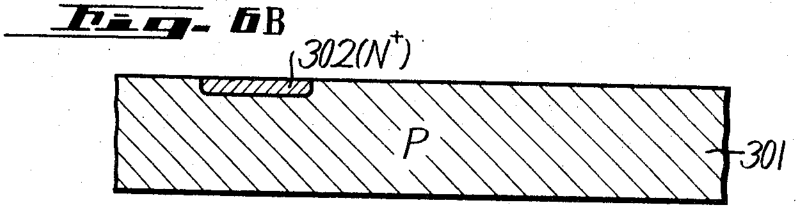

The next step consists in the formation of an N-type buried layer 302 in the single crystal semiconductor substrate 301 at a predetermined location by the diffusion of, for example, phosphorus through a diffusion mask formed of a silicon oxide film, as shown in FIG. 6B. The buried layer 302 has a sheet resistance of 5 ohms per square centimeter and is provided for ultimately reducing the collector saturated resistance Rs of the transistor Q.

Figure 6C:
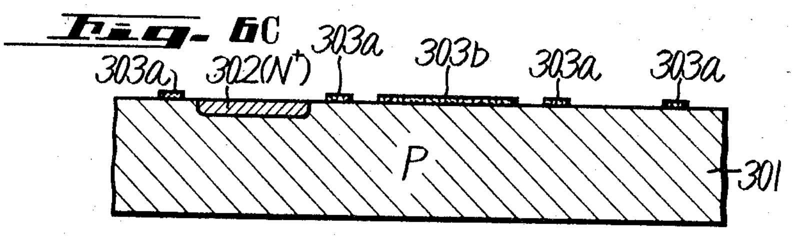

Then, seeding sites **303*a* and 303*b* for polycrystalline development, which will be described later, are formed on the upper surface 301*a* of the substrate 301 selectively at predetermined areas, as illustrated in FIG. 6C. The seeding sites 303*a* and 303*b* may be those which are formed by vapor deposition of, for example, silicon heated with electron beams or those which are formed by decomposition of monosilan $SiH_4$ or silicon halide, for example, silicon tetrachloride in the presence of a hydrogen gas to provide silicon and by depositing the resulting silicon on the aforementioned single crystal semiconductor substrate 301. With the vapor deposition or vapor growth techniques, the seeding sites are formed over the entire area of the upper surface 301*a* of the single crystal semiconductor substrate 301, in which case the seeding sites 303*a* and 303*b*** are selectively formed by a method disclosed in my copending U.S. Pat. application No. 781,542, filed on Dec. 5, 1968. It will also be seen that the seeding sites can be formed by the sandblast, scratching, sputtering or like method under suitable conditions. In the manner described above, there is provided a layer of seeding sites, formed of a fine material of no crystallographic axis, which is convenient for the subsequent formation of a polycrystalline layer. Instead of the seeding sites, a noncrystalline layer as of silicon dioxide may be formed by thermal oxidation or decomposition.

Subsequent to the formation of the seeding sites **303*a* and 303*b*, a silicon vapor growth layer 304 is formed by the vapor growth techniques on the upper surface 301$a$ of the single crystal semiconductor substrate 301 containing the seeding sites 303$a$ and 303$b$. In a typical vapor growth process, the substrate is heated in a reaction chamber at a temperature of about 1,100° to 1,200° C. and a gas stream containing vapors of silicon tetrachloride and arsenic trichloride serving as an impurity is passed over the heated substrate for about ten minutes under the presence of a hydrogen gas supplied at the rate of 8 litres per minute, thereby forming the N-type vapor growth layer 304 of about 10** microns.

Figure 6D:
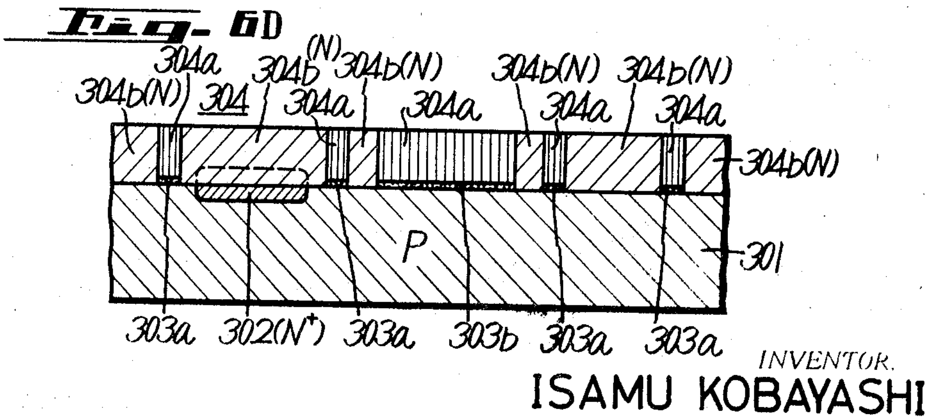

The vapor growth layer 304 thus formed consists of polycrystalline vapor growth regions 304$a$ grown on the seeding sites 303$a$ and 303$b$ and single crystal vapor growth regions 304$b$ directly grown on the upper surface 301$a$ of the substrate 301, as clearly illustrated in FIG. 6D. The polycrystalline vapor growth regions 304$a$ are the same as that of FIG. 1.

In this case, it is preferred that the upper surface 301$a$ of the single crystal semiconductor substrate 301 is selected to be a plane 100. Namely, with the use of the plane 100, the single crystal vapor growth regions 304$b$ become thicker than the polycrystalline vapor growth regions 304$a$, so that, in the case of masking by a contact method in a subsequent process, the single crystal vapor growth layers support the mask so as to avoid scratching of the surface of the mask with rough surfaces of the polycrystalline vapor growth regions 304$a$.

Figures 6E, 6F, 6G, 6H:
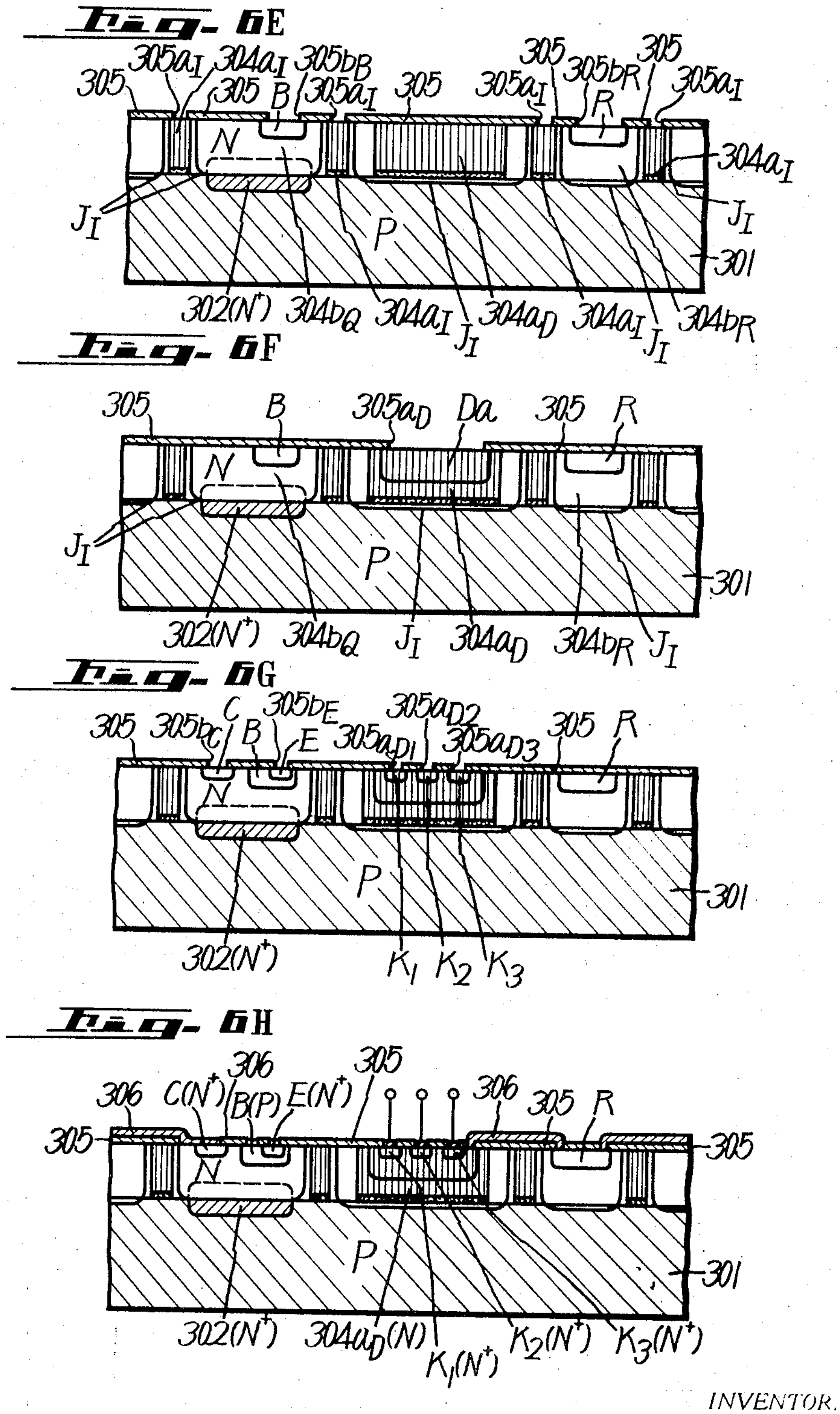
Figure 7A:
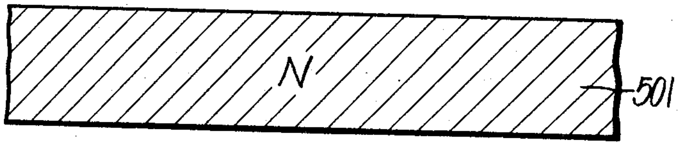
FIG. 7 illustrates steps in another modified form of this invention.
Figure 7B:
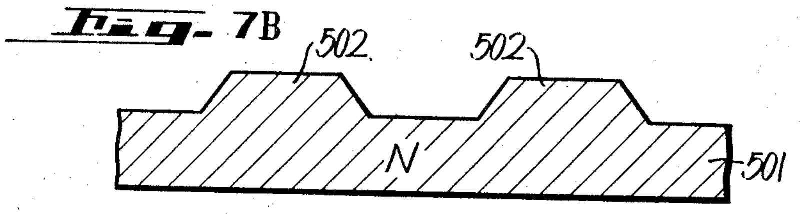
Figure 7C:
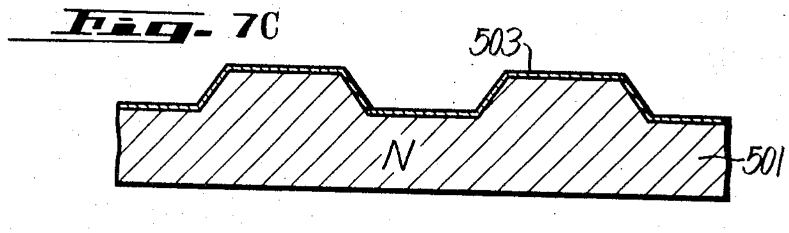
Figure 7D:
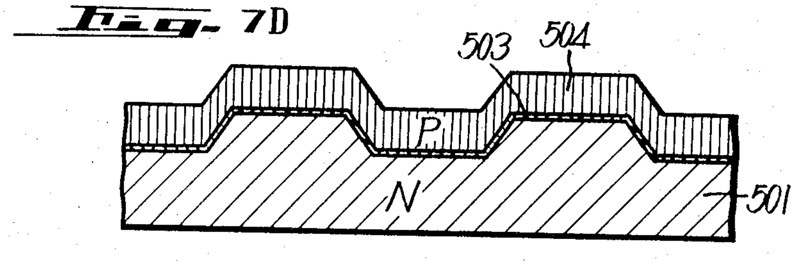
Figure 7E:
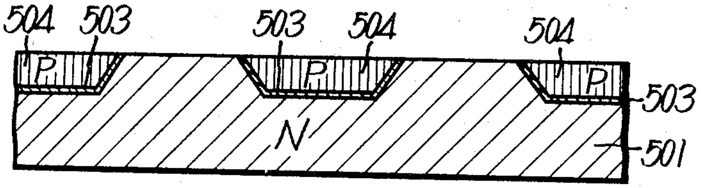
Figure 7F:
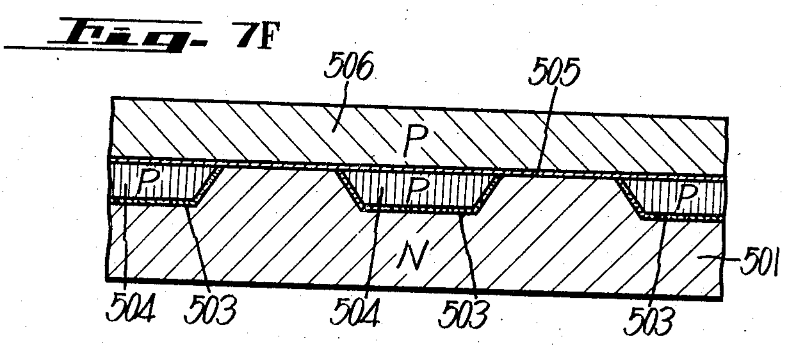
Figure 7G:
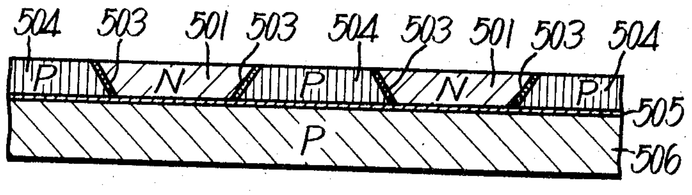
Figure 7H:
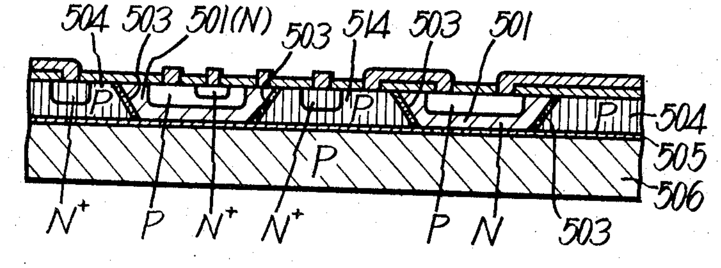

Then, the upper surface of the vapor growth layer 304 is coated with a silicon oxide film 305 by means of thermal oxidation or decomposition or vapor deposition or with a silicon nitride film by sputtering silicon in a nitrogen gas. Windows for subsequent impurity diffusion are formed, for example, in the silicon oxide film 305 by the use of a photoresist material such as KPR or AZ (trademark) in a known manner. In the illustrated example, windows 305$a_I$, 305$b_B$ and 305$b_R$ are formed respectively on a polycrystalline vapor growth region 304$a_I$ for isolation use, a single crystal vapor growth region 304$b_Q$ for ultimately forming the transistor Q and a single crystal vapor growth region 304$b_R$ for forming the resistor R, as shown in FIG. 6E. Then, a P-type impurity, for example, boron oxide is decomposed at a temperature of, for example, 950° C. and predeposited on the surfaces of the vapor growth layer 304 exposed through the diffusion windows 305$a_I$, 305$b_B$ and 305 $b_R$, after which the wafer is heated in an oxidizing atmosphere at about 1,200° C. for 30 minutes, thereby to cause diffusion of the impurity. Since the impurity diffusion velocity in the polycrystalline region is higher than that in the single crystal region as previously described, the impurity on the polycrystalline regions rapidly diffuses down past the regions and into the single crystal semiconductor substrate 301 and diffuses from the polycrystalline vapor growth regions 304$a$ into the single crystal vapor growth regions 304$b$ to form junctions $J_1$, thus isolating the regions from adjacent ones as illustrated in the figure. (It is also possible that an N-type impurity is diffused into a polycrystalline vapor growth region 304$a_D$ in advance of the above impurity diffusion so as to permit one portion of the junction isolating this region to be formed in the single crystal semiconductor substrate 301.) In the single crystal vapor growth regions 304$b_Q$ and 304$b_R$ there are respectively formed a base region B and a resistor region R as depicted in FIG. 6E. Further, one portion of the silicon oxide film 305 is etched away to form a window 305$a_D$ on the polycrystalline vapor growth region 304$a_D$ in which the diodes $D_1$ to $D_3$ will be ultimately formed. Then, a P-type impurity, for example, boron is diffused through the window 305$a_D$ into the polycrystalline vapor growth region 304$a_D$ to form therein an anode region D$a$ of the input diodes $D_1$ to $D_3$ as depicted in FIG. 6F. In this case the aforementioned windows 305$a_I$, 305$b_B$ and 305$b_R$ are covered with oxide films formed during the above impurity diffusion.

Following this, the silicon oxide film 305 is removed at selected areas to form therein windows 305$b_C$, 305$b_E$, 305$a_{D1}$, 305$a_{D2}$ and 305$a_{D3}$, through which an N-type impurity, for example, phosphorus is diffused to provide a collector conducting region C in the single crystal vapor growth region 304$b_Q$ which will serve as the collector region of the transistor Q, an emitter region E in the aforementioned base region B and cathode regions $K_1$ to $K_3$ in the anode region D$a$ of the input diodes $D_1$ to $D_3$ as depicted in FIG. 6G.

Thus, there are provided the input diodes $D_1$ to $D_3$, the transistor Q and the resistor $R_1$ which constitute one portion of the NAND circuit shown in FIG. 5.

Further, the silicon oxide film 305 is selectively etched away to provide sites for the attachment of electrodes on the collector region C, base region B and emitter region E of the transistor Q, the anode region Da of the input diodes $D_1$ to $D_3$, the cathode regions $K_1$ to $K_3$ of the diodes and the resistor region R forming the resistor $R_1$. Then, an electrode metal, for example, aluminum is vapor-deposited on the sites and excess metal is removed to provide electrodes 306, thus providing a semiconductor integrated circuit such as illustrated in FIG. 6H.

With the present invention, the respective elements are formed in the single crystal vapor growth regions and the polycrystalline vapor growth regions selectively formed as above described, so that the characteristics of the elements are essentially different. Namely, even if semiconductor elements of the same kind are formed, their characteristics are different, and hence elements of different characteristics can be formed on the same substrate.

Since the input diodes $D_1$ to $D_3$ are formed in the polycrystalline vapor region selectively formed, the diodes can be provided with a characteristic which cannot be given unless the polycrystalline vapor growth region is used, that is, high-speed property (it has been ascertained that the operating time is one the order of nano-second). Namely, the single crystal and polycrystalline regions, which are quite different from each other, are formed integrally by the selective formation of at least the polycrystalline regions, into which an impurity is diffused to form elements in the respective regions, so that elements of essentially different characteristics can be readily formed integrally and simultaneously by a method which is not different from the conventional method of making semiconductor integrated circuits using a substrate entirely formed of a single crystal semiconductor.

Accordingly, when one circuit is constituted by the combination of elements of different characteristics, in the prior art method separate elements are connected to, for example, a printed-circuit board by means of lead wires. In the present invention, however, the elements are interconnected through the electrodes vapor-deposited on one surface of the semiconductor wafer, so that neither stray capacitance nor stray reactance is produced as experienced in the prior art and this provides for, for example, enhanced high-speed response of the integrated circuit.

FIG. 7 illustrates another example of this invention as applied to the manufacture of a semiconductor integrated circuit. The manufacture begins with the preparation of an N-type single crystal semiconductor substrate 501 formed of, for instance, silicon as shown in FIG. 7A. Then, the N-type single crystal semiconductor substrate 501 is etched away selectively at predetermined areas to provide mesa-like projections 502 as depicted in FIG. 7B. Thereafter, the upper surface of the substrate 501 including the projections 502 is entirely deposited with a layer 503 of seeding sites for polycrystalline development such as previously referred to, as shown in FIG. 7C. On the seeding site layer 503 a P-type polycrystalline silicon vapor growth layer 504 is formed by the vapor growth techniques as depicted in FIG. 7D. After this, the polycrystalline vapor growth layer 504 is removed by means of, for example, lapping from above down to the upper surface of the projections 502 of the single crystal semiconductor substrate 501, thus leaving the polycrystalline vapor growth layer 504 selectively at each of those areas of the single crystal semiconductor substrate 501 which have been etched away, as shown in FIG. 7E. Next, a P-type polycrystalline vapor growth layer 506 is formed by the vapor growth method through a layer 504 of seeding sites for polycrystalline development on the entire area of the surface in which the polycrystalline vapor growth layers 504 are selectively formed, as illustrated in FIG. 7F. The polycrystalline vapor growth layer 506 is to mechanically reinforce the finished semiconductor integrated circuit. After this, the single crystal semiconductor substrate 501 is removed by means of, for example, lapping from its underside to that of the polycrystalline vapor growth layer 504 in FIG. 7F, leaving the single crystal semiconductor substrate 501 selectively only between the polycrystalline vapor growth layers 504 as shown in FIG. 7G. Following this, desired semiconductor elements are formed by a known method in the polycrystalline vapor growth layers 504 and in this single crystal semiconductor substrate 501, thus providing a semiconductor integrated circuit such as illustrated in FIG. 7H.

The same operational results as the aforementioned ones can be apparently obtained with the semiconductor integrated circuit thus produced and accordingly no description will be given. If necessary the polycrystalline vapor growth layer 504 and the single crystal semiconductor substrate 501 may be spaced apart from one another between the elements as in the case of a known beam-lead integrated circuit.

The present invention is not limited specifically to the monolithic type semiconductor integrated circuits exemplified in the foregoing but is applicable to a beam-lead or dielectric type semiconductor integrated circuits or a semiconductor integrated circuit of the type in which seeding sites for polycrystalline development are formed on a sapphire; polycrystalline vapor growth regions are selectively formed on the seeding sites and single crystal vapor growth regions are formed; and impurities are diffused into the vapor growth regions to provide therein elements of essentially different characteristics.

The conductivity types in the foregoing examples are not limited specifically to the mentioned ones. In addition, although the present invention has been described in detail in connection with the cases of using silicon, it will be seen that the invention can be practiced by the use of germanium or other intermetallic compounds.

It will be apparent that many modifications and variations may be effected without departing from the scope of the novel concepts of this invention.

I claim as my invention:

1. In a semiconductor device having a semiconductor substrate and a vapor growth layer, the vapor growth layer comprising a single crystal region and two polycrystalline regions each having a plurality of vapor growth crystals of a size of 0.6 to 30 microns, one of the polycrystalline regions being of one impurity type and the second polycrystalline region being of the opposite impurity type, said two polycrystalline regions forming at least one PN junction therebetween.

2. An integrated circuit semiconductor device comprising a chip of semiconductor material which includes a layer having discrete polycrystalline regions separated by monocrystalline regions, said layer having a plurality of PN junction devices within said discrete polycrystalline regions, said junctions being in planes parallel to one plane of said chip, the polycrystals of said polycrystalline regions being acicular with longitudinal axes aligned perpendicular to said one plane and having a grain size of from 0.6 to 30 microns.

3. An integrated circuit semiconductor device according to claim 2 in which certain of said junction devices differ in electrical characteristics from other of said junction devices.

4. A discrete semiconductor diode formed of polycrystalline material having a P-type polycrystalline region and an N-type polycrystalline region forming a PN junction therebetween, the polycrystals of said polycrystalline regions being substantially acicular and disposed substantially at right angles to said PN junction and having a grain size of from 0.6 to 30 microns.

5. A discrete semiconductor diode formed of polycrystalline material having a P-type polycrystalline region and an N-type polycrystalline region forming a PN junction therebetween, the polycrystals of said polycrystalline regions being elongated and having their longitudinal axis disposed substantially at right angles to said PN junction and having a grain size of from 0.6 to 30 microns.

6. A semiconductor device comprising a substrate; a layer of amorphous semiconductor seeding site material on said substrate; a semiconductor epitaxial layer on said seeding site material, said epitaxial layer being polycrystalline and having polycrystals of a grain size of from 0.6 to 30 microns; and at least one PN junction formed in said polycrystalline epitaxial layer.

* * * * *